US009460760B2

(12) United States Patent
Jayaraman et al.

(10) Patent No.: US 9,460,760 B2
(45) Date of Patent: Oct. 4, 2016

(54) DATA-DEPENDENT SELF-BIASED DIFFERENTIAL SENSE AMPLIFIER

(71) Applicant: GLOBALFOUNDRIES INC., Cayman Islands (KY)

(72) Inventors: Balaji Jayaraman, Bangalore (IN); Thejas Kempanna, Bangalore (IN); Toshiaki Kirihata, Poughkeepsie, NY (US); Ramesh Raghavan, Bangalore (IN); Krishnan S. Rengarajan, Bangalore (IN); Rajesh R. Tummuru, Bangalore (IN)

(73) Assignee: GLOBALFOUNDRIES INC., Cayman Islands (KY)

( * ) Notice: Subject to any disclaimer, the term of this patent is extended or adjusted under 35 U.S.C. 154(b) by 0 days.

(21) Appl. No.: 14/604,009

(22) Filed: Jan. 23, 2015

(65) Prior Publication Data
US 2016/0217832 A1    Jul. 28, 2016

(51) Int. Cl.
*G11C 7/06* (2006.01)
*G11C 7/08* (2006.01)

(52) U.S. Cl.
CPC ..... *G11C 7/062* (2013.01); *G11C 7/08* (2013.01)

(58) Field of Classification Search
CPC .................................. G11C 7/062; G11C 7/08
USPC ................ 365/189.02, 207, 208, 230.02
See application file for complete search history.

(56) References Cited

U.S. PATENT DOCUMENTS

| 4,170,741 A * | 10/1979 | Williams ........... G11C 16/0466 |
| | | 327/55 |
| 7,532,529 B2 * | 5/2009 | Dadashev ........... G11C 11/5642 |
| | | 365/189.07 |

(Continued)

FOREIGN PATENT DOCUMENTS

| DE | 10 2008 014 12 | 10/2009 |
| EP | 2 299 450 B1 | 3/2011 |
| WO | WO 2009/034603 A1 | 3/2009 |

OTHER PUBLICATIONS

Bhattacharya et al., "Design and Implementation of a High-Speed, Power-Efficient, Modified Hybrid-Mode Sense Amplifier for SRAM Applications", 2013 26th International Conference on VLSI Design and 2013 12th International Conference on Embedded Systems (VLSID),Jan. 5-10, 2013, pp. 209-214.

(Continued)

*Primary Examiner* — Tha-O H Bui
(74) *Attorney, Agent, or Firm* — Scully Scott Murphy and Presser

(57) ABSTRACT

A system and method of operating a twin-transistor single bit multi-time programmable memory cell to provide a high gain, sensing scheme for small signals. The memory cell includes a pair of a first transistor and a second transistor providing a differential signal output. The first transistor of the memory cell couples a first circuit leg having a first current source load transistor and the second transistor couples a second circuit leg having a second current source load transistor. A programmed value is represented by a voltage threshold shift in one of the first or second transistors. A feedback circuit receives one of: a first signal or a second signal of the differential signals, and generates, in response, a feedback signal which is simultaneously applied to bias each current source load transistor in each the first and second circuit legs to amplify a voltage differential between the differential signal outputs.

25 Claims, 7 Drawing Sheets

(56) References Cited

U.S. PATENT DOCUMENTS

| | | |
|---|---|---|
| 2005/0063236 A1 | 3/2005 | Pagliato et al. |
| 2005/0105358 A1 | 5/2005 | Schweickert et al. |
| 2007/0041259 A1 | 2/2007 | Terzioglu et al. |
| 2009/0010041 A1 | 1/2009 | Afghahi et al. |
| 2014/0269124 A1 | 9/2014 | Seningen et al. |

OTHER PUBLICATIONS

Chung et al., "A Novel High-Speed Sense Amplifier for Bi-NOR Flash Memories", IEEE Journal of Solid-State Circuites, vol. 40, No. 2, Feb. 2005, pp. 515-522.

\* cited by examiner

DATA-DEPENDENT SELF-BIASED DIFFERENTIAL SENSE AMPLIFIER

FIELD OF INVENTION

This disclosure relates generally to electronic circuits such as non-volatile memory circuits of the multi-time programmable type, and particularly a novel differential sense amplifier circuit and system that improves sensitivity to voltage threshold detection of biased memory bit cell states.

BACKGROUND

In high density memory systems, a typical non-volatile memory cell may include a metal-oxide semiconductor (MOS) transistor whose threshold voltage may be varied for storing a desired information, e.g., by injecting charges into a floating gate or gate oxide. Accordingly, a current sunk by the memory cell in determining biasing states varies depending on the information stored therein. For example, to store information in a twin-transistor single-bit memory cell there is provided two different threshold voltage values for the cell, with each different threshold voltage value associated with a different logic or bit value.

For example, FIG. 1A shows an exemplary non-volatile memory CMOS thin-oxide multi-time programmable memory (MTPM) cell 10 which may be part of a memory device, or system. As shown, the MTPM cell 10 is a twin-transistor single-bit memory cell including first and second transistors 15A, 15B connected in series between first and second cell terminals 14 and 16 sharing a common source line (SL). The first transistor 15A is shown exhibiting a first threshold voltage (Vt), e.g., its native Vt or initial value, and the second transistor 15B exhibiting an induced second threshold voltage, e.g., a Vt+shift (added) voltage.

The CMOS MTPM bit cell structure 10 shown in FIG. 1A further includes two gate electrodes 20A, 20B respectively of the respective first and second transistors 15A, 15B and which are connected to a common wordline (WL) conductor 50.

The first cell terminal 14 may be a drain terminal and the second cell 16 terminal may be a drain terminal—both of which may serve as complementary bitline (BL) terminals (BLs), e.g., BLT (bitline true), BLC (bitline complement), respectively. BLC and BLT can be interchangeable. Other configurations of terminals are known. As further shown, a further source line (SL) is coupled to the connected source of device 15B and source terminal of device 15A. This common transistor terminal 13 is tied to a ground or a 0 volt neutral connection according to the known Grounded Source-Line (GSL) architecture. However, the architecture may be an Elevated Source-Line (ESL) architecture.

A plurality of memory cells may be interconnected by SLs, BLs and gate lines to form a memory array. For example, the two transistors 15A, 15B are designated as "On" cells having a common gate terminal that is held at a high voltage (~Vdd), however, as shown, other bit cells comprising twin-transistors for other multi-time programmable bit cells may provided as shown in FIG. 1A. For example, further twin-transistors cell (in an Off state) is shown with a first transistor exhibiting a first threshold voltage, e.g., native Vt or initial Vt, and the second transistor exhibiting a second threshold voltage, e.g., Vt+shift (added) voltage. Similar connections for the off-cell transistors are provided to the BLT and BLC (bitline) conductors however their gates are controlled by a separate wordline control 51. Thus, each cell pair may be separately programmed to have a Vt shift induced in either the True or the Complement transistor of the twin-cell.

As known, a threshold voltage Vt is the minimum gate voltage that is needed to be applied to turn on a transistor. The transistor undergoes a Vt shift when it is programmed. Typical Vt values may be about 0.25V to 0.3V. When the transistor is subjected to a high gate voltage (~2 to 2.2V), and high drain voltage (~1.5V-1.8V), with source grounded, for a few milliseconds (i.e. when it is programmed), its Vt gets shifted from its nominal value to a higher value (e.g., ~0.45 to 0.5V) due to BTI (Bias temperature instability) and HCI (hot carrier injection) effects.

For memory write operations, a write control circuit 25 may control writing to the target memory bit cell 10, e.g., in a memory array. For a write operation, an input digital data signal Din represents a programmable bit value to be written to the target memory cell 10 by controlling application of a WL voltage, a BLT voltage a BLC voltage, and an SL voltage to the cell transistors 15A, 15B. That is, write circuit drivers 25 may be implemented to generate and apply programming voltages for bitline true (BLT) and bitline complement (BLC) conductors for writing a bit voltage value to the cells 15A, 15B. The target cell is accessed, e.g., via a voltage provided on the wordline WL 50 corresponding to a row of the memory cell, and bit cell voltage values are written to the T or C cell by applying appropriate voltages to the BLT and BLC terminals corresponding to a selected column (complementary lines) of the target memory cell 10. For example the target multi-time programmable bit cell programming voltages generated are applied to WL, BLT and BLC, e.g., while grounding the SL source line.

When no WL signal is applied, the MOS transistors 15A, 15B do not conduct, but retain their programmed states. The MOS transistors are configured (programmed) to store a logic state. Combinations of voltages can be applied to the first terminal, second terminal and gate terminals of the memory cell 10 to program, inhibit program, read and erase the logic state stored by the MOS transistors.

FIG. 1B shows a chart 40 explaining different modes of operation of the multi-time programmable memory cell 10 of FIG. 1A including example voltages at the terminals of the cell transistors 15A, 15B that provide cell states including stand-by, write, read and reset.

In the current GSL scheme, the cell could be in four different states. These are: 1) a standby state when respective BLT and BLC terminals 14, 16 are floating with a wordline WL of 0.0 Volts applied to the gates of each transistor in the twin-cell 15B, 15A; 2) a write state, e.g., when the respective BLT terminal 14 is at 1.7 Volts and BLC terminal 16 is at 0.0 Volts with a wordline WL of 2.2 Volts applied to the gates of each transistor 15B, 15A; however, the voltages on BLT and BLC could be swapped to store a different logic value in the cell; 3) a read state when each respective BLT terminal and BLC terminal voltage values are close to about 0.5 volts with a voltage delta between BLT and BLC proportional to the Vt shift in the cell, and a wordline WL of 1.0 Volt (VDD) is applied to the gates of each transistor 15B, 15A in the twin-cell; and 4) an erase state, e.g., when the respective BLT terminal 14 is at 1.7 Volts and BLC terminal 16 is at 0.0 Volts with a wordline WL of −1.0 Volts applied to the gates of each complementary transistor 15B, 15A.

Referring to FIG. 1A, generally, in electronic circuits having such bit memory cells 10, the sense amplifier circuit 30 is provided for obtaining a stored bit value, i.e., perform a memory read operation. Typically, the sense amplifier 30 senses whether the T (true) or C (complement) transistor is programmed (Vt shifted). Such sense amplifier circuit 30 reads a selected bit cell BLT voltage and BLC voltage value at respective BLT terminal 14 and BLC terminal 16 conductors for cells selected by an applied WL voltage and as selected by a respective corresponding column select transistor 22B and 22A to select the corresponding target cell via a corresponding Col_Select (T) select signal 23B and/or Col_Select (C) select signal 23A for complementary signals. The column select signals 23A and 23B are the same for one pair of BLT and BLC conductors. As shown in FIG. 1B, the conventional sense amplifier circuit 30 performs a differential read.

In the read operation, the programmed BLT (or BLC) value is dependent upon the sense circuitry of the sense amplifier and across process/voltage/temperature variations. However, the sense amplifier circuitry 30 needs to detect a small differential voltage, e.g., small shifts in Vt signal in the cell between the true/complement transistors 15A, 15B, that may result from a possible threshold voltage shift, e.g., during a read operation 35 of FIG. 1B. For example, the read states of about 0.5 volts (500 mV) with a small data-dependent differential voltage built between BLT and BLC are shown in FIG. 1B for the sensing of BLT programmed state.

Current sense amplifier solutions are limited in that complex sensing structures are required for sensing small signal levels in the cell. Simpler circuits exist only for large signals in bit cells (e.g., SRAM, DRAM applications where difference between stored values is on the order of a ~VDD (e.g., a supply rail voltage).

There is no sensing scheme that could be employed in cases where a small differential voltage (resulting from a possible threshold voltage shift) could be sensed.

SUMMARY

A system, method and sensing circuit for sensing bit values from a memory cell that could be employed in cases where a small differential voltage (e.g., resulting from a possible threshold voltage shift) is to be sensed.

The system and sensing circuit includes a self-biased, data-dependent differential sense amplifier scheme that biases itself, and also produces a very good signal margin.

In one aspect, there is provided a method of operating a multi-time programmable bit cell having a differential signal output. The method comprises: sensing, using a feedback circuit, one of: a first or a second signal of the differential signal outputs; generating, responsive to a sensed first or second signal, a feedback signal; and applying the feedback signal to bias a series load transistor of the twin-transistor single-bit cell, the biasing signal used to amplify a voltage differential between the differential signal outputs such that a programmed threshold voltage Vt shift in the cell is detected.

Further to this aspect, the multi-time programmable bit cell is a pair of a first transistor and a second transistor sharing common wordline (WL) and source line (SL), a programmed bit value is represented by a voltage threshold shift in one of the first or second transistor.

Moreover, the first transistor of the multi-time programmable bit cell couples a first circuit leg having a first current source load transistor providing a first differential signal output, and the second transistor of the multi-time programmable bit cell couples a second circuit leg having a second current source load transistor providing a second differential signal output, the method further comprises: applying, using the feedback circuit, the feedback signal to a respective gate of each the first and second current source load transistors to simultaneously bias each the first and second current source load transistors in each the first circuit leg and second circuit leg.

In a further aspect, there is provided a sense circuit for a Vt-shift based multi-time programmable twin-transistor bit-cell, the cell having a pair of a first transistor and second transistor providing a first true bitline voltage and a second complement bitline voltage output. The sense circuit comprises: a first current source load transistor coupled to the first transistor of the cell; a second current source load transistor coupled to the second transistor of the cell; and a negative feedback circuit configured as a negative feedback loop, the negative feedback circuit receiving one bitline voltage output of a single corresponding transistor and outputting a bias signal that biases each the first current source load transistor and second current source load transistor such that a programmed threshold voltage Vt shift in the cell is detected, wherein the current source load is biased in a manner dependent upon the data value of the one bitline voltage output.

In a further aspect, there is provided a memory system comprising an array of memory cells, each memory cell comprising a multi-time programmable twin-transistor bit-cell providing a differential signal output; a write circuit for programming a threshold voltage (Vt) shift value in a twin-transistor memory cell; and a sense amplifier circuit for receiving the differential signal outputs and outputting a corresponding logic value, wherein a multi-time programmable twin-transistor memory cell comprises: a pair of a first transistor and second transistor providing a first true bitline voltage and a second complement bitline voltage output, and a first current source load transistor coupled to the first transistor of the cell; a second current source load transistor coupled to the second transistor of the cell; and a negative feedback circuit configured as a negative feedback loop, the negative feedback circuit receiving one bitline voltage output of a single corresponding first or second transistor and outputting a signal to bias each the first current source load transistor and second current source load transistor such that a programmed threshold voltage Vt shift in the cell is detected, wherein the current source load is biased in a manner dependent upon the data value of the one bitline voltage output.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION

There is provided a sense circuit for a threshold voltage shift (Vt-shift) based memory system that includes data-dependent differential sense amplifier employing negative feedback. The sense circuit provides for the amplification of a Vt shift in one of the bit-cells (true or BLT cell or complement BLC cell) to provide a differential signal between the two BLs of a selected memory cell circuit. The differential signal is input to a cross-coupled sense amplifier for detection.

Figure 1B:
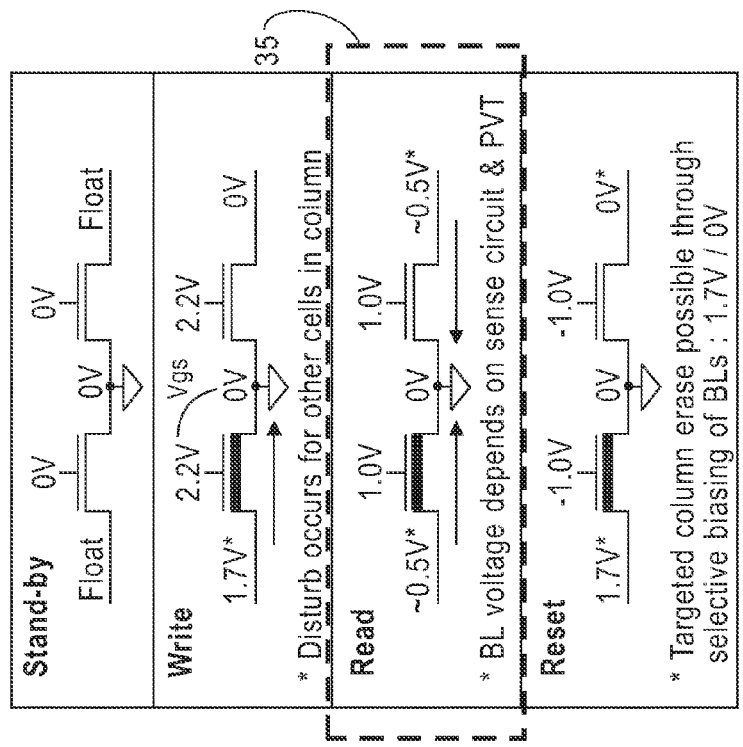
FIG. 1B depicts a chart explaining different modes of operation of the multi-time programmable memory cell 10 of FIG. 1A and the exemplary voltage levels sensed by a conventional sense amplifier circuit.
Figure 1A:
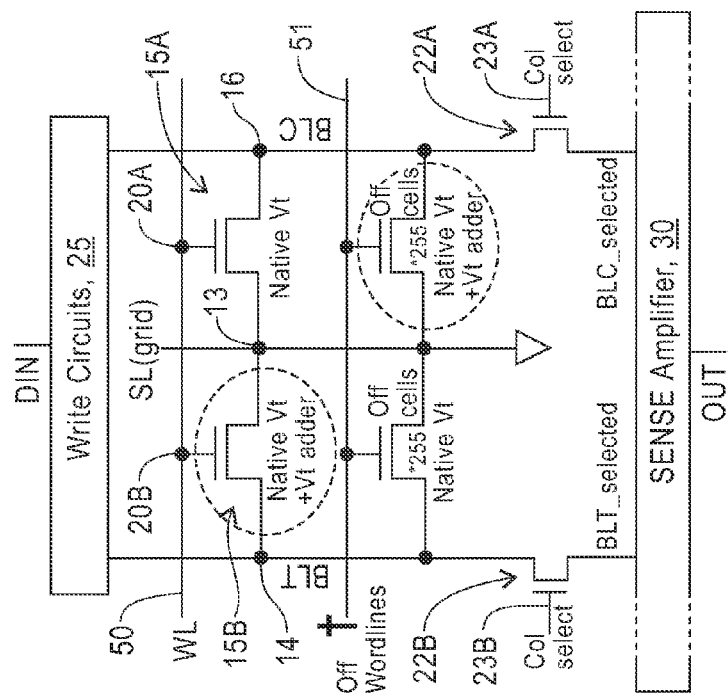
FIG. 1A depicts a conventional MTP non-volatile multi-time programmable memory cell circuit 10.
Figure 2A:
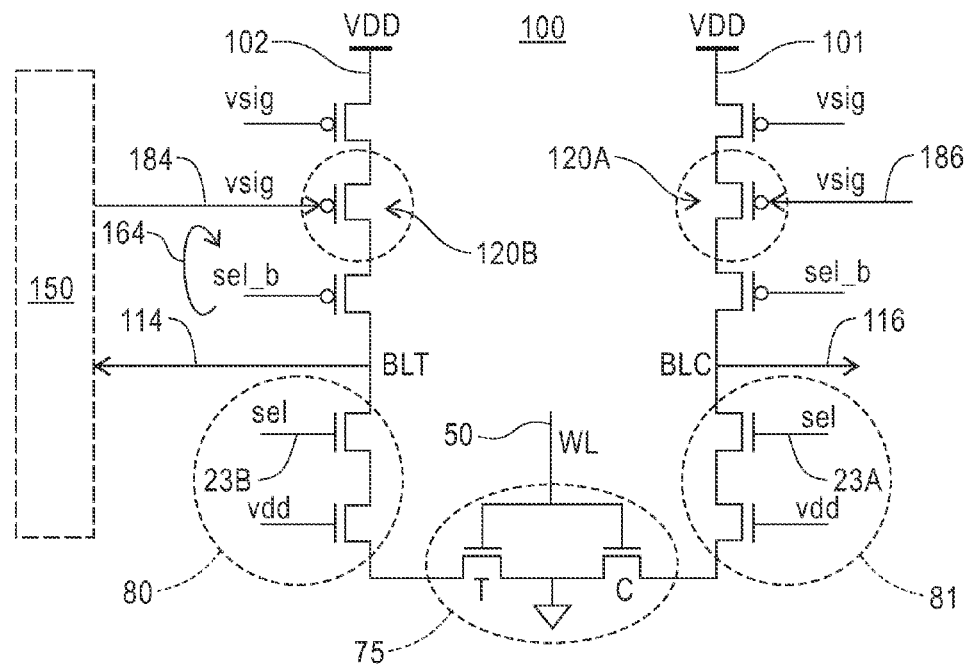
FIG. 2A depicts a proposed sense circuit 100 according to one embodiment that is adapted to sense only a BLT signal and provide a feedback self-bias signal that sets a vsig value (bias to the PMOS load transistor in the memory cell circuit)

In one embodiment, FIG. 2A depicts a feedback circuit 150 that accepts BLT as an input from a selected MTP MOS memory cell circuit 100. In the architecture depicted, MTP MOS memory cell circuit 100 may comprise elements of the MTPM cell 10 of FIG. 1A, particularly, a common source amplifier configuration with self-biased PMOS current source load transistors, e.g., 120A, 120B, where a signal "vsig" is a gate bias that is applied to one or more PMOS transistors. The feedback circuit 150 includes circuitry for providing a feedback self-bias signal 184 based on the received BLT signal value to set a vsig value (i.e., a bias to the MTP MOS memory cell circuit 100). As known, the PMOS load transistors help in defining the voltage values at BLT and BLC. The strength of PMOS loads gets varied with a vsig bias voltage.

In the embodiment depicted, the MTP MOS memory cell circuit 100 of FIG. 2A includes a common source amplifier configuration twin-transistor single-bit memory cell 75 (such as described with respect to FIG. 1A), including coupled first and second transistors where one transistor of the couple stores data as a Vt shift(=native threshold voltage+added voltage due to programming) on either the T or C transistor. Although not shown, the memory bit cell 75 may include a range of threshold voltages such that the memory cell may hold two different logic states based on which of the T or C transistor is programmed. At the true leg 102, series coupled circuit elements 80 include two FET devices with a first device having a gate connected to "sel", where the first device is the column mux (i.e., column select transistor, e.g., activated by a corresponding Col_Select (T) select signal 23B), and a second device having a gate connected to "vdd" to function as a protect transistor device. Likewise, at the complement leg 101, series coupled circuit elements 81 include a column select transistor, e.g., activated by a corresponding Col_Select (C) select signal 23A, and a coupled protect transistor device. The column select signals 23A and 23B are the same (denoted as "sel" in FIG. 2A) for one pair of BLT and BLC conductors. As known, the column "sel" signals are used to select one out of many columns in a memory array (not shown).

In operation, in the embodiment of FIG. 2A, when reading a programmed differential bit cell value in twin-transistor cell 75, corresponding wordline WL 50 is activated and column select lines 23A and 23B are activated to select the corresponding column multiplexer (col mux) transistors to enable reading of the differential (true and complement) bit values output on the BLT (bitline true) conductor 114 and BLC (bitline complement) conductor 116. In the embodiment, feedback circuit 150 receives the BLT voltage and generates a feedback signal, vsig signal 184, that is fed back as a self-bias signal to corresponding PMOS transistors 120A, 120B on both T and C legs 101, 102. Due to this self-biased (no external bias needed) feedback loop 164, the gain transistor (of the twin-transistor bit-cell) is consistently biased, across process/voltage/temperature variations, in the saturation region, where the Vt shift in the cell 75 is best detected. In this case, the bias is generated from the "True" leg 102 and is used for biasing both current source loads (e.g., transistors 120A, 120B) in both legs.

Figure 2B:
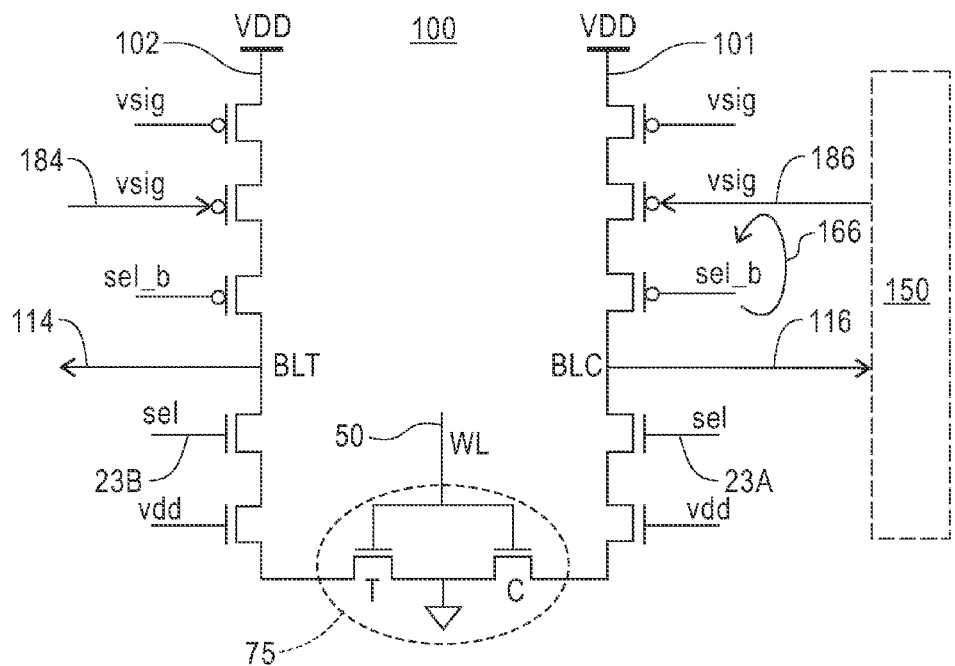
FIG. 2B depicts the proposed sense circuit 100 according to an alternate embodiment that is adapted to sense only a BLC signal and provide a feedback self-bias signal that sets a vsig value (bias to the PMOS load transistor in the memory cell circuit)

As further shown in an alternate embodiment of FIG. 2B, the same feedback circuit 150 of FIG. 2A may be adapted to only receive a BLC signal of the selected MTP MOS memory cell circuit 100 with the sensing circuit 150 providing a feedback self-bias signal 186 based on the received BLC signal value to set the vsig value (bias to the MTP MOS memory cell circuit 100). Thus, in likewise operation, in the embodiment of FIG. 2B, when reading a programmed bit cell value, corresponding wordline WL 50 is activated and column select line signals 23A and 23B are set to activate the corresponding col mux transistors to enable reading of the differential bit value output on the BLC (bitline complement) conductor 116. Sensing circuit 150 receives the BLC voltage and produces a feedback signal, vsig signal 186, that is fed back as bias to corresponding PMOS transistors 120A, 120B on both T and C legs 101, 102.

In particular, in the embodiments of FIG. 2A, the circuit 150 generates a negative feedback signal vsig signal 184 in a direction 164 that opposes any change in BLT 114. For example, if BLT voltage were to increase from its stipulated value for some reason, then the feedback circuit would generate a vsig that would render the PMOS transistor, e.g., transistor 120B, weaker, to result in bringing down the BLT voltage value to its initial value. As "vsig" is connected to the gates of PMOS current source loads in both—BLT leg 101 as well as the BLC leg 102 in circuit 100, it would also in like manner render transistor 120A, weaker, to result in bringing down the BLC voltage value in like amount. Likewise, as shown in the embodiment of FIG. 2B, the circuit 150 generates a negative feedback signal vsig signal 186 in a direction 166 that opposes any change in BLC 116. For example, if BLC voltage were to increase from its stipulated value for some reason, e.g., temperature, then the feedback circuit would generate a vsig that would render PMOS transistor, e.g., transistor 120A, weaker, to result in bringing down the BLC voltage value to its initial value. It would also in like manner render transistor 120B, weaker, to result in bringing down the BLT voltage value in like amount.

Figure 2C:
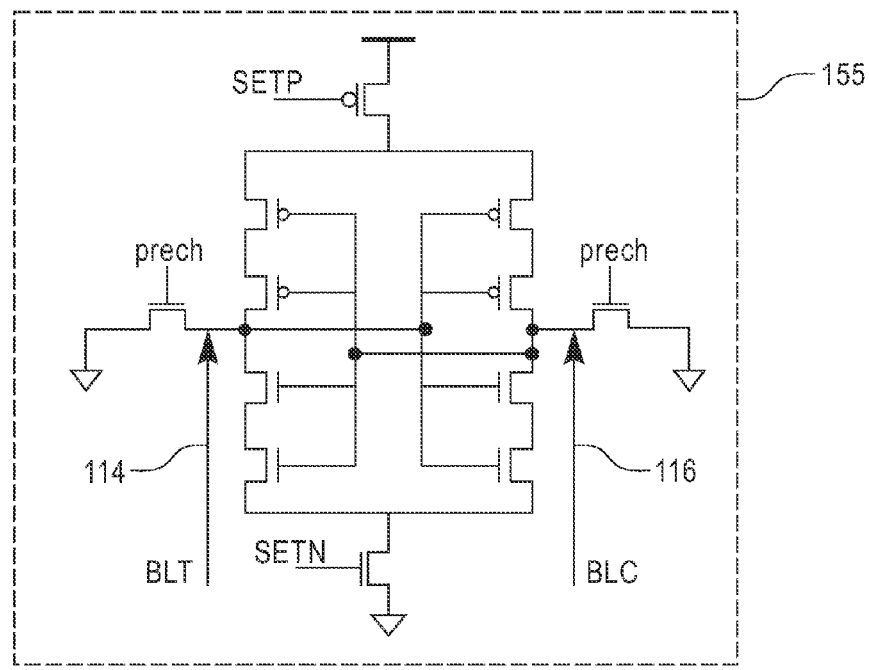
FIG. 2C depicts an example embodiment of a cross-coupled sense amplifier used in conjunction with the proposed sense circuits 100 of FIGS. 2A and 2B.

In one embodiment, FIG. 2C shows a conventional cross-coupled sense amplifier 155 that receives the differential BLT and BLC voltages and outputs a corresponding bit logic value. That is, during memory cell read, the BLT 114 and BLC 116 are each fed to cross-coupled voltage sense amp to produce a rail-to-rail output.

Figure 3:
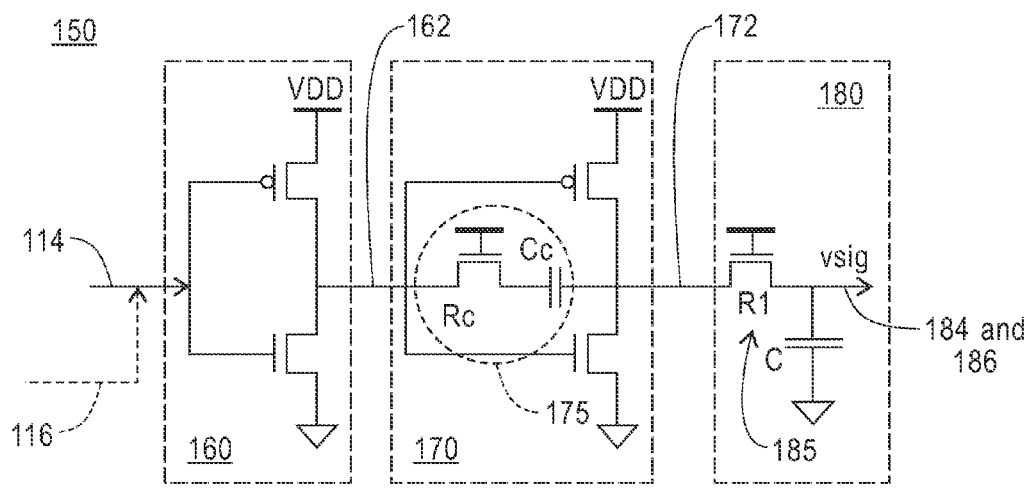
FIG. 3 depicts an example sense circuit 150 according to one embodiment.

FIG. 3 depicts the feedback circuitry 150 according to a first embodiment that can be used in conjunction with the circuit embodiments of FIGS. 2A, 2B and 2C for detecting MTPM cell bits. Referring to FIG. 2A (or FIG. 2B) it is shown in the circuit that the BLT voltage value 114 (output of the common source amplifier (circuit 75)) is fed back as an input to the feedback circuit 150, which generates the vsig voltage 184, 186 to bias respective PMOS transistor current source loads 120A, 120B.

As shown in FIG. 3, self-biasing circuit 150 includes a first high gain stage 160 including an inverter device (e.g., NFET/PFET pair) that receives the BLT signal 114 (in the embodiment of FIG. 2A), or alternatively, may receive the BLC signal 116 (in the embodiment of FIG. 2B). This high gain stage 160 feeds gain signal 162 to a second high gain stage 170 which includes phase compensation circuitry 175. Second high gain stage 170 may include a series RC network (Rc, Cc) between an input and an output of the second inverter stage 170 to improve stability through phase compensation, i.e. RC network 175 introduces a delay in the loop so as to prevent phase reversal at any node in the loop with any meaningful gain (a gain greater than a unity gain). The signal output 172 of the second high gain stage 170 is fed into a dominant pole circuit 180 to provide the vsig signals 184 and 186 (in either of the embodiments of FIG. 2A, FIG. 2B). At the output of two feedback gain stages 160, 170, dominant pole circuit 180 includes an RC network 185 that dampens any oscillations triggered by step changes in signal or supply. This circuit tends to move a high-frequency pole to a low frequency that stabilizes the system against oscillations. Thus, the phase shifted signal output of the feedback stages (i.e. the intermediate node between R1 and C) is tapped out as "vsig" and is fed as the bias to the current source loads. AS shown in FIG. 3, R1 can be implemented as an "ON" transistor.

Through the two high-gain stages 160, 170 and a current source load such as provided by load transistors 120A, 120B, the BL signal (114 or 116) received in circuit 150 is biased at about the mid-point of the supply rail voltage "VDD" (i.e., the supply voltage for the circuits). Thus, in the first embodiment, the BLT voltage value is kept close to VDD/2 so as to maximize the differential gain obtained from the amplifier circuit 100. For the gain to be high, both the transistors in the twin-cell (T or C) and the PMOS load have to be operated in saturation region. Keeping the BLT close to VDD/2 helps maintain the transistors in saturation region. Typical values of VDD may range from 0.9V-1V. In one embodiment, VDD/2 may thus range from about 0.45V-0.5V. The "Trip point" of the inverter stage is the approximate voltage applied to its input which would trip the output voltage, i.e., when the input voltage to the inverter is ramped from 0 to VDD, the output will stay at VDD till the input voltage is approximately (about) VDD/2. Once the input crosses ~VDD/2, the output goes to 0, and the input voltage at which this sharp transition occurs is the "trip point". In the present case, the negative feedback ensures that BLT (or BLC) is kept at a voltage value at about ~VDD/2 which is the trip point of the first inverter.

Thus, sensing circuit 100 may be viewed as a feedback amplifier circuit in a closed-loop circuit configuration. If the loop is opened at BLT and if the input to the first inverter stage is BLT1, then BLT1 is being fed as the input to the high gain stages (inverters) (in circuit 150). The output from that block (vsig) drives the PMOS load, and then BLT is obtained at the drain of the PMOS transistor. For the circuit to be stable (not leading to oscillations), the phase difference between BLT and BLT1 to be much greater than 0 degrees when the gain (amplitude(BLT1)/amplitude(BLT)) reaches unity. Rc and Cc circuit values helps to improve this phase difference. R1 and C is the dominant pole circuit in 150. Thus to avoid having two poles at same frequency, one of the poles is pushed to a lower frequency by adding R1 and C having values to result in a dominant pole.

Figure 4:
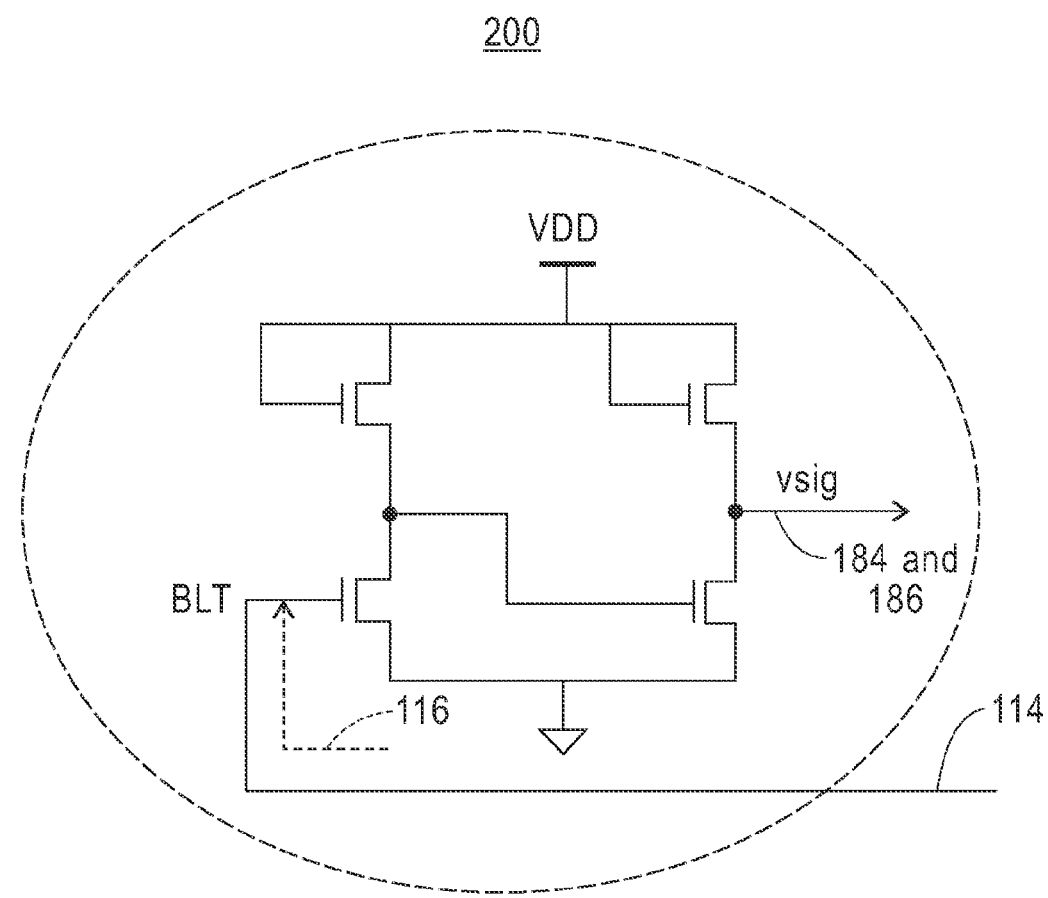
FIG. 4 shows an example sense circuit 200 according to an alternate embodiment.

As an alternative to use of feedbackcircuitry 150, FIG. 4 depicts a feedback circuitry 200 according to a second embodiment that can be used in conjunction with the circuit embodiments of FIGS. 2A, 2B and 2C for detecting MTPM cell bits. That is, similar as the first embodiment, in reference to FIG. 2A (or FIG. 2B), the BLT voltage value 114 (output of the common source amplifier (circuit 75)) is fed back as an input to the feedback circuit 200, which generates the vsig voltage 184, 186 to bias respective PMOS transistor current source loads 120A, 120B and drive both the PMOS loads on the BLT and BLC legs. Circuit 200 functions similarly as circuit 150 of FIG. 3 however the need of the RC network at the inverter output is eliminated, thus saving silicon area.

As shown in FIG. 4, self-biasing feedback circuit 200 is a smaller area implementation structure that avoids the use of capacitors by using slightly reduced gain feedback stages. For good yield, this may require that the wordline be biased to a lower value. The operation of the feedback circuit 200 in the second embodiment is similar to the first embodiment of FIG. 3. This circuit 200 also modulates vsig to keep BLT within reasonable limits when T transistor is programmed. In this embodiment, in the feedback circuit 200, PFETs are replaced with diode-connected NFETs. That is, the NFET loads (NFETs at the circuit top) have their drains and gates shorted rendering the configuration as "diode-connected". This circuit configuration of FIG. 4 reduces the open-loop gain of the feedback circuit 200 thereby obviating the need for an additional phase compensation circuit (Rc, Cc) and dominant pole circuit (R1, C1) that were used in the first embodiment circuit 150. This provides significant silicon chip area savings; however, at the expense that the WL voltage needs to be lowered from VDD, e.g., by about 0.2V for the circuit to be operational. Thus, the feedback circuit 200 of the second embodiment could be used in cases where area is critical, and where there is a provision to provide a WL voltage different from VDD.

In operation, for each embodiment, due to this self-biasing feedback loop, the gain transistor is consistently biased, across process/voltage/temperature variations, in the saturation region, where the Vt shift in the cell is best detected. The feedback bias is generated from one of the True or Complement legs and is used for biasing both current source loads 120A, 120B. No external bias is needed. Since vsig voltage value is same to bias both the PMOS current source loads (biasing transistor loads 120A, 120B), and the true and complement arms 102, 101 are symmetric with balanced parasitics, the Vt shift in one of the bit-cells is amplified to provide a differential signal between the two BLs. This differential BLT and BLC input feeds to a cross-coupled sense amplifier (FIG. 2C) such that BLT is ~VDD/2 and BLC gets modulated with the Vt shift. In one embodiment, if the BLT cell is programmed, then BLC<BLT; otherwise, if the BLC cell is programmed, BLC>BLT. Thus, the BLT/BLC outputs of circuit 100 are the same as the BLT/BLC inputs shown in the cross-coupled sense amplifier circuit 155 as shown in FIG. 2C to produce rail-to-rail signals (outputs).

Figure 5A:
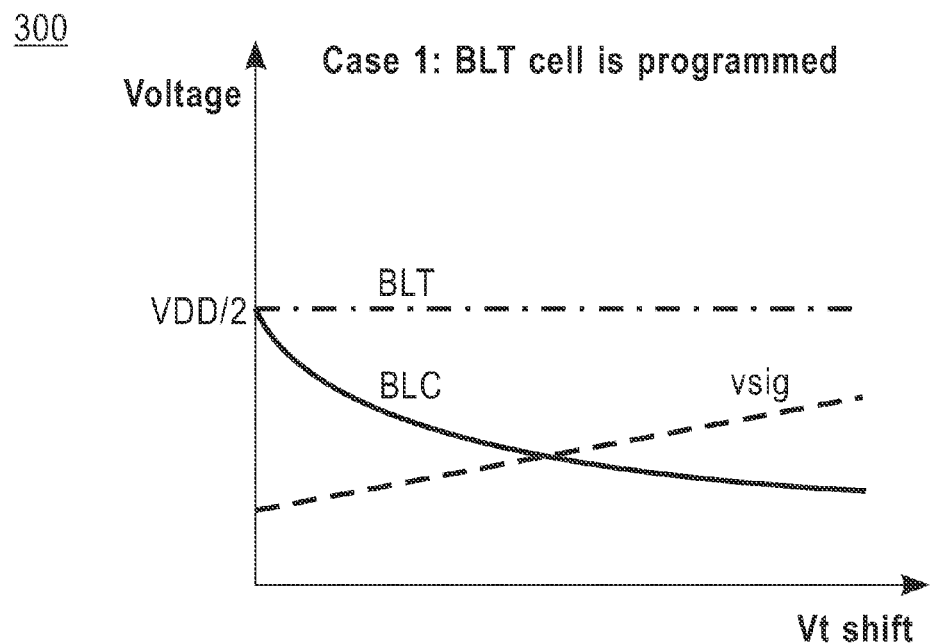
FIGS. 5A and 5B depict voltage diagrams for generating BLT and BLC as a function of stored memory bit cell with FIG. 5A showing generated BLT and BLC voltage curves when the cell corresponding to BLT is Vt shift programmed and FIG. 5B showing generated BLT and BLC voltage curves when the cell corresponding to BLC is Vt shift programmed in one embodiment.
Figure 5B:
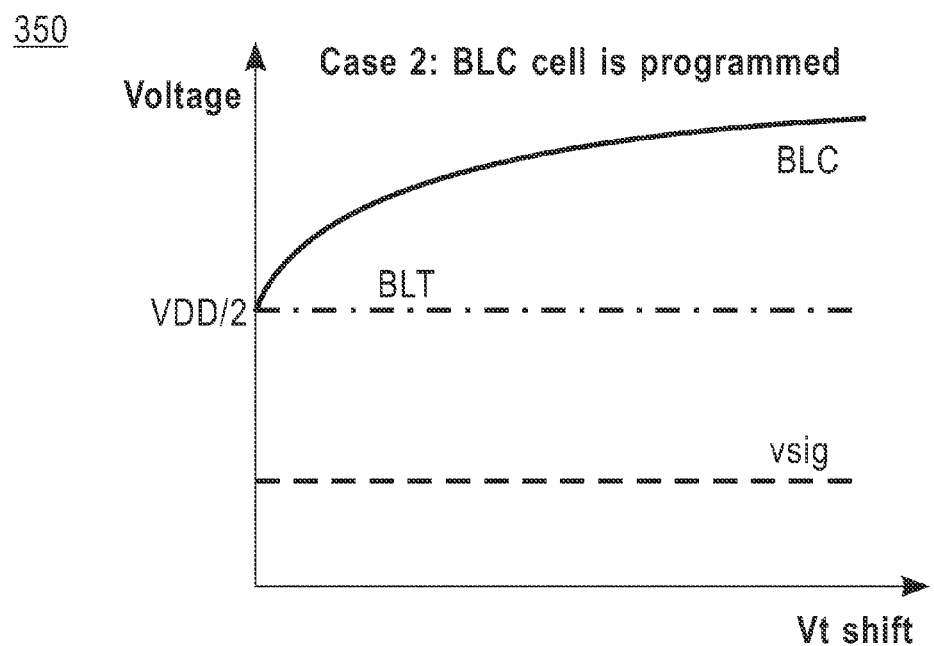

FIGS. 5A and 5B depict voltage diagrams for generating BLT and BLC as a function of stored memory bit cell values Vt shift (shown on the x-axis) where a Vt shift value present on a particularly transistor cell (T or C transistor) means that cell is programmed, i.e., its Vt is greater than that of the other transistor (C or T transistor). Both embodiments of the feedback circuit 150 or 200 assume the grounded SL sensing scheme with the negative feedback-based PMOS current source bias.

FIG. 5A particularly depicts voltage operation 300 for a complete range of Vt shift from 0 to VDD showing a first case operation where the BLT Cell is programmed (T transistor is programmed having Vt shift). Here, the feedback circuit 150 or 200 is shown providing a vsig for adjusting the vsig PMOS load bias signal so as to maintain BLT close to VDD/2 (trip point of inverter). In this embodiment, responsively, the feedback circuit 150 or 200 produces the vsig signal that modulates the BLC output signal value towards 0 volts with the increasing Vt-shift. More particularly, in FIG. 5A, where T transistor is programmed, the x-axis shows the amount of Vt shift it experiences. As the Vt shift increases, with the feedback action, vsig keeps increasing to maintain BLT voltage value constant at about ~VDD/2. That is, the inverters pair are used as high gain stages and to set the bias point for BLT to be close to VDD/2. This increased vsig lowers the bias to PMOS load on the BLC arm, and makes the PMOS load weaker compared to the C transistor. Thus, BLC gets pulled down towards 0V with increase in Vt shift in T transistor.

With respect to FIG. 5B, when memory cell C transistor is programmed, since T transistor experiences no Vt shift, vsig remains constant. With increase in Vt shift, C transistor gets weaker and BLC gets pulled towards VDD. That is, FIG. 5B particularly depicts voltage operation 350 for a complete range of Vt shift from 0 to VDD showing an operation where the BLC Cell is programmed (C transistor is programmed having Vt shift). In this embodiment, it is shown how the PMOS bias value vsig is held constant. Feedback circuit 150 or 200 is shown adjusting the vsig PMOS load bias signal so as to maintain BLT close to VDD/2 (trip point of inverter) and responsively modulates BLC to move towards VDD with the Vt shift.

Figure 6A:
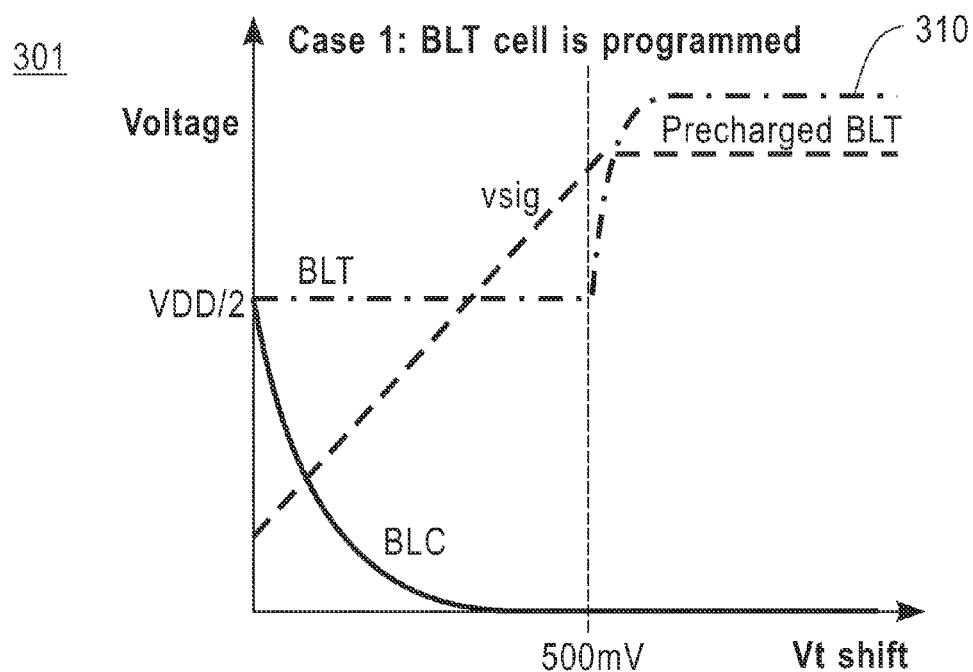
FIGS. 6A and 6B (corresponding to respective FIG. 5A and FIG. 5B) show generated BLT and BLC voltage curves according to the self-biasing sensing circuit of the present invention responsive to the further increase in Vt shift (e.g., for a particular case where Vt shift>>500 mV)
Figure 6B:
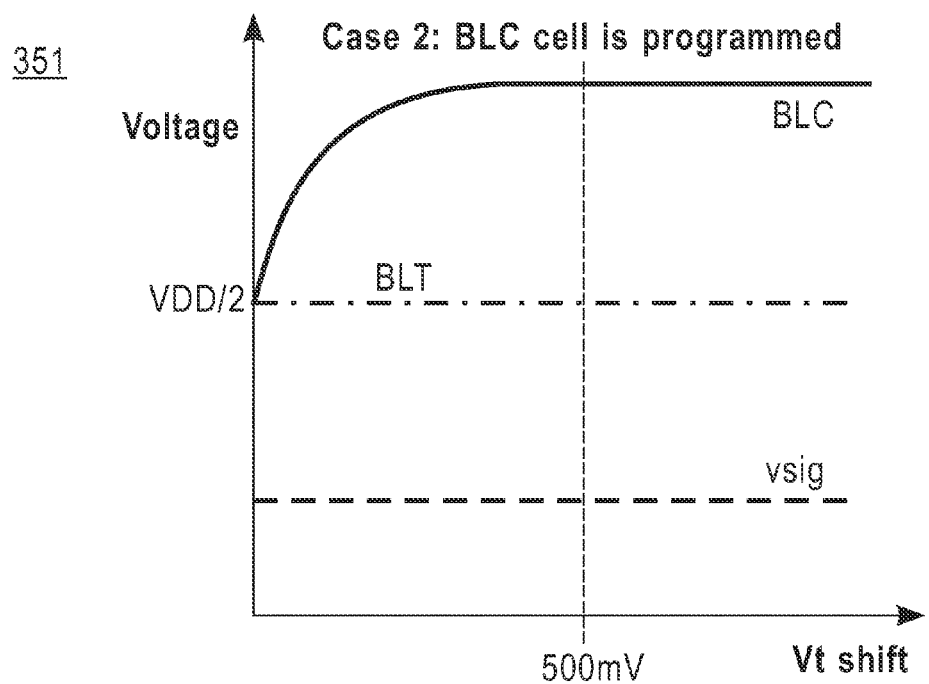

In one embodiment, BLT and BLC (bitlines) may be pre-charged to a known voltage (e.g., VDD) in the pre-charge phase, which is before the sense operation. FIGS. 5A and 5B depict voltage diagrams are shown for Vt values much less than the inverter trip point, i.e., Vt<<500 mv. FIG. 6A (corresponding to respective FIG. 5A) shows resulting voltage curves 301 and FIG. 6B (corresponding to respective FIG. 5B) shows resulting voltage curves 351 with a further increase in Vt shift being sensed (e.g., for a particular case where Vt shift>>500 mV). With this larger Vt shift, the feedback circuits 150 or 200 will provide a vsig that gets saturated, such that the T transistor becomes so weak that the BLT line does not get discharged from its precharged value 310 of VDD. Unlike in the unsaturated case (Vt shift<500 mV), vsig value remains constant with increase of Vt shift (Vt shift>>500 my).

For each of the first and second embodiments described with respect to FIGS. 3 and 4, typical circuit and voltage values for 32 nm node (technology) implementations include, but are not limited to: Resistance Rc as approximately 0.8K ohms (realized as an ON NFET (with gate connected to VDD) (and having a W=0.312 um, L=0.04 um in the first embodiment); Capacitance Cc being about: ~25 fF (realized using a MOSFET with source and drain shorted (e.g., W=25 um, L=0.04 um) in the first embodiment); capacitance C being about: ~0.6 pF. (e.g., in the first embodiment); R1 being about: ~160 ohms (e.g., realized as an ON NFET (with gate connected to VDD): W=1.56 um, L=0.04 um in the first embodiment); vsig being about: 0 to VDD (gets adjusted based on the Vt shift) and a typical range is from about 0.3V to 0.7V; Supply voltage VDD being about: 0.9V; BLT voltage being about: ~0.45V and BLC voltage being about 0 to VDD, based on the Vt shift.

Figure 7:
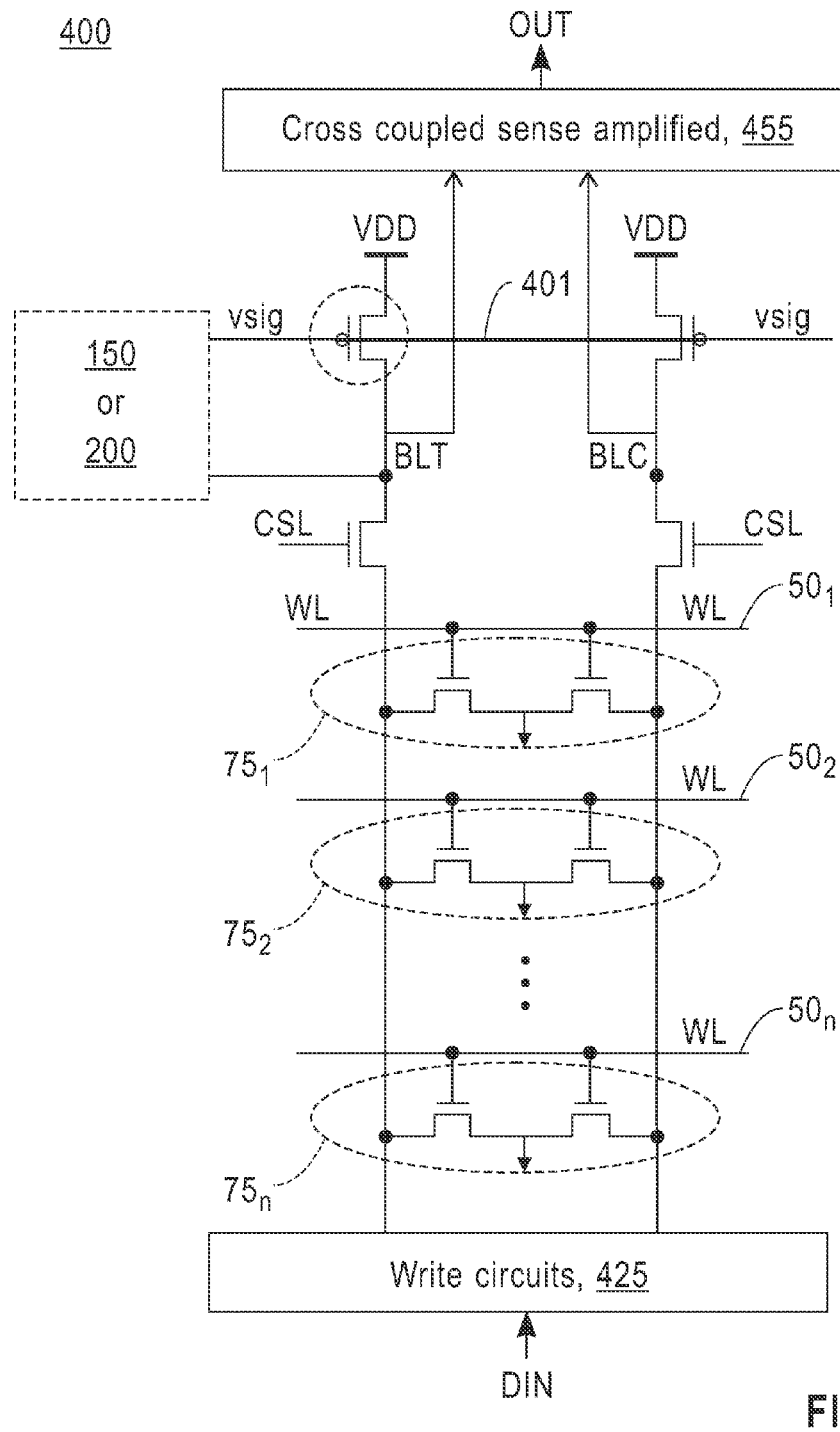
FIG. 7 shows a memory system that includes an array of memory cells 400 adapted for the self-biasing data-dependent processing of the embodiments herein.

FIG. 7 shows a configuration of a circuit depiction of a memory system 400 that includes an array of memory cells 75, each memory cell comprising a multi-time programmable twin-transistor memory cell $75_1$, $75_2$ ... $75_n$ each providing a differential signal output at BLT and BLC nodes. Each twin-transistor memory cell $75_1$, $75_2$ ... $75_n$ is shown selectable with a respective wordline WL $50_1$, $50_2$ ... $50_n$. Although not shown, it is assumed that the array 400 is coupled to a write circuit for programming a threshold voltage (Vt) shift value into a selected twin-transistor memory cell 75, and a sense amplifier circuit for receiving the differential signal outputs and outputting a corresponding logic value in the manner as described herein. As further shown in FIG. 7, the memory system includes the write circuits 425 for programming a selected twin-transistor bit-cell, and cross-coupled sense amplifier circuit 455 for receiving the BLT and BLC values required to determine the programmed bit value of the selected twin-transistor bit-cell.

In this embodiment, corresponding to the embodiment of FIG. 2A, each multi-time programmable twin-transistor memory cell 75 includes a pair of a first transistor and a second transistor sharing a common Source line (SL), providing a first true bitline voltage at BLT and a second complement bitline voltage output at BLC. A first current source load transistor 120B coupled to the first transistor of the cell and a second current source load transistor 120A is coupled to the second transistor of a cell. The negative feedback circuit employed may be of the circuit 150 embodiment of FIG. 3 or the circuit embodiment 200 of FIG. 4 and is configured as a negative feedback loop for receiving one bitline voltage BLT output outputting a vsig signal to bias the gate of the first current source load transistor 120B on the first leg and bias the gate of the second current source load transistor 120A on the second leg such as by use of a common conductor 401, as shown in FIG. 7. In this manner, a programmed threshold voltage Vt shift in the cell 75 is more easily detected by biasing the current source loads of the cell in a manner dependent upon the data value of the one bitline voltage BLT output.

It should be understood that the memory system 400 in the embodiment of FIG. 3 may employ either feedback circuit 150 of FIG. 3 or the feedback circuit 200 in the embodiment of FIG. 4 and may be operated with any MOS MTPM memory system and associated circuit structures that store a bit value as a voltage threshold shift per memory cell. Further, referring to FIG. 7, the hardware embodiment of the multi-time programmable memory system is in a grounded source line architecture or "Grounded SL sensing" (GSL) which refers to the configuration of the bit-cell 75 where the source node of the transistors in the bit cell is referred to as "SL". Since SL is grounded, this is "Grounded SL" sensing. Programming the cell would mean creating a Vt shift in the cell (T or C). In one embodiment, the vsig voltage gets set automatically based on the feedback and the Vt shift in the cell. The feedback ensures that BLT is kept close to VDD/2, which is the trip point of the first inverter (NFET/PFET pair) in circuit 150 of FIG. 3.

Thus, the functioning of circuit 150 or 200 is to keep BLT constant at about ~VDD/2 volts (e.g., trip point of the inverter) and provide an appropriate bias voltage (vsig) to both the PMOS loads. For example, let the BLT initially be close to VDD to begin with. This BLT signal is fed as an input to the self-bias generation circuit 150 (or 200) that has two inverters as two high-gain stages. The generated vsig signal is close to VDD which turns the PMOS load off in the circuit 100. This in response brings down the BLT voltage value. On the other hand, if BLT were initially to be close to 0V, then the generated vsig will be close to 0V, which will turn the PMOS loads fully on, making the BLT to go higher. Thus, the feedback circuit modulates the bias to PMOS load (vsig) so as to keep BLT close to VDD/2. Since the same generated vsig is provided as bias to the BLC arm as well, the relative strengths of C transistor-cell and the PMOS current source load would result in BLC going low as shown in the FIG. 5A for the example case where the T transistor cell is programmed. Thus a voltage delta is developed between BLC and BLT which is fed to cross-coupled sense amplifier 155 to provide rail-rail outputs. Similarly, as shown in the FIG. 5B, when the Vt-shift is on the C transistor-cell, then BLC goes up towards VDD, creating a differential voltage ((BLT−BLC) delta) in the opposite direction which is then fed to cross-coupled sense amplifier 155 to provide rail-rail outputs.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for operating a multi-time programmable bit cell providing a differential signal output comprising:
   a feedback circuit for receiving one of: a first signal or a second signal of said differential signal output, said feedback circuit generating, responsive to the first or the second signal, a negative feedback signal, said feedback circuit applying said negative feedback signal to bias a current source load transistor connected in series with said programmable bit cell, said biasing said connected series current source load transistor used to amplify a voltage differential between said first signal and said second signal of said differential signal output such that a programmed threshold voltage Vt shift in the cell is detected; and
   a cross-coupled sense amplifier for receiving said amplified voltage differential between said first and said second signal of said differential signal output and outputting a corresponding logic value.

2. The apparatus of claim 1, wherein said multi-time programmable bit cell is a pair of a first transistor and a second transistor where a programmed bit value is represented by a voltage threshold shift in one of said first or second transistor.

3. The apparatus of claim 1, wherein said first transistor of said multi-time programmable bit cell couples a first circuit leg having a first current source load transistor providing a first differential signal output, and said second transistor of said multi-time programmable bit cell couples a second circuit leg having a second current source load transistor providing a second differential signal output, said feedback circuit applying said feedback signal to simultaneously bias each said first and second current source load transistor in each said first circuit leg and second circuit leg.

4. The apparatus of claim 1, wherein said feedback circuit comprises a first high-gain inverter stage and a second high-gain inverter stage in a closed-loop configuration.

5. The apparatus of claim 4, wherein a high-gain inverter stage includes phase compensation circuitry for introducing a delay in the closed-loop configuration so as to prevent phase reversal at any node in the feedback circuit with a gain greater than unity.

6. The apparatus of claim 4, wherein an output of a high-gain inverter stage includes a dominant pole network for providing an output signal achieving a frequency response with increased stability of said feedback circuit.

7. The apparatus of claim 4, wherein said feedback circuit provides said negative feedback signal to ensure that a first signal of said differential signal output is maintained close to a pre-defined value for improved gain.

8. The apparatus of claim 7, wherein said high-gain inverter stage includes a connection of an NFET transistor and a PFET transistor pair, said pre-defined value for improved gain comprises a value equivalent to a trip point of the NFET/PFET pair of said first high-gain inverter stage.

9. The apparatus of claim 7, wherein said pre-defined value for improved gain comprises a value of about VDD/2 where VDD is a supply voltage for both said multi-time programmable bit cell and for said feedback circuit.

10. The apparatus of claim 2, wherein said first transistor and said second transistor include a source node, each said pair of first transistor and said second transistor configured to include a common grounded source line.

11. A method of operating a multi-time programmable twin-transistor bit-cell providing a differential signal output comprising:
    sensing, using a feedback circuit, one of: a first or a second signal of said differential signal output;
    generating, responsive to a sensed first or second signal, a negative feedback signal; and
    applying said negative feedback signal to bias a current source load transistor connected in series with said twin-transistor bit-cell, said biasing negative feedback signal used to amplify a voltage differential between said first signal and said second signal of said differential signal output such that a programmed threshold voltage Vt shift in the cell is detected.

12. The method of claim 11, wherein said multi-time programmable bit cell is a pair of a first transistor and a second transistor sharing a common source line, a programmed bit value is represented by a voltage threshold shift in one of said first or second transistor.

13. The method of claim 11, wherein said first transistor of said multi-time programmable bit cell couples a first circuit leg having a first current source load transistor providing a first differential signal output, and said second transistor of said multi-time programmable bit cell couples a second circuit leg having a second current source load transistor providing a second differential signal output, said method comprising:

applying, using said feedback circuit, said negative feedback signal to a respective gate of each said first and second current source load transistors to simultaneously bias each said first and second current source load transistors in each said first circuit leg and second circuit leg.

14. The method of claim 11, further comprising: amplifying, in said feedback circuit, one of said sensed first or second signals of said differential signal outputs using a first high-gain inverter stage and a second high-gain inverter stage.

15. The method of claim 14, wherein said feedback loop provides said first high-gain inverter stage and a second high-gain inverter stage in a closed feedback circuit-loop configuration, said method further comprising:

providing phase compensation in said feedback circuit to introduce a delay in the closed-loop configuration so as to prevent phase reversal at any node in the feedback circuit with a gain greater than unity.

16. The method of claim 14, wherein an output of a high-gain inverter stage includes a dominant pole network for achieving a frequency response with increased stability of said feedback circuit.

17. The method of claim 14, further comprising: maintaining, using said negative feedback signal, a first signal of said differential signal output close to a pre-defined value for improved gain.

18. The method of claim 17, wherein said high-gain inverter stage includes a NFET/PFET pair, said pre-defined value for improved gain comprises a value equivalent to a trip point of the NFET/PFET pair of said first high-gain inverter stage.

19. The method of claim 17, wherein said pre-defined value for improved gain comprises a value VDD/2 where VDD is a supply voltage for both said multi-time programmable bit cell and for said feedback circuit.

20. A sense circuit for a Vt-shift based multi-time programmable twin-transistor single-bit memory cell, said cell having a pair of a first transistor and second transistor sharing a common source line, and providing a first true bitline voltage and a second complement bitline voltage output, said sense circuit comprising:

a first current source load transistor coupled in series to the first transistor of said cell;

a second current source load transistor coupled in series to the second transistor of said cell; and a negative feedback circuit configured as a negative feedback loop, said negative feedback circuit receiving one bitline voltage output of a single corresponding transistor and outputting a bias signal that biases each said first current source load transistor and second current source load transistor such that a programmed threshold voltage Vt shift in the cell is detected, wherein said first or second current source load transistor is biased in a manner dependent upon the data value of said one bitline voltage output.

21. The sense circuit of claim 20, wherein said negative feedback circuit comprises:

a high-gain stage circuit coupled to a gate of said first current source load transistor and a gate of said second current source load transistor, said high-gain stage circuit providing said bias signal to bias said one bitline voltage output to a value of about the mid-point of a supply rail voltage where the Vt shift in the cell is best detected;

a signal damping network at the output of said high-gain stage circuit to dampen any oscillations triggered by a output voltage change or a change in said supply rail voltage; and a filter network to introduces a delay in the negative feedback circuit loop so as to prevent phase reversal at any node in the loop with a gain greater than unity.

22. The sense circuit of claim 20, further comprising:

a cross-coupled sense amplifier for receiving wherein said amplified voltage differential signal outputs such that said first true bitline voltage achieves a value of about the mid-point of a supply rail voltage and said second complement bitline voltage output is modulated according to said Vt shift.

23. A memory system comprising:

an array of memory cells, each memory cell comprising a multi-time programmable twin-transistor single-bit memory cell providing a differential signal output;

a write circuit for programming a threshold voltage (Vt) shift value in the twin-transistor single-bit memory cell; and a sense amplifier circuit for receiving said differential signal outputs and outputting a corresponding logic value, wherein a multi-time programmable twin-transistor single-bit memory cell comprises:

a pair of a first transistor and second transistor providing a first true bitline voltage and a second complement bitline voltage output, and a first current source load transistor coupled in series to the first transistor of said cell;

a second current source load transistor coupled in series to the second transistor of said cell; and a negative feedback circuit configured as a negative feedback loop, said negative feedback circuit receiving one bitline voltage output of a single corresponding first or second transistor and outputting a signal to bias each said first current source load transistor and second current source load transistor such that a programmed threshold voltage Vt shift in the cell is detected, wherein said first or second current source load transistor is biased in a manner dependent upon the data value of said one bitline voltage output.

24. The memory system of claim 20, wherein said negative feedback circuit comprises:

a high-gain stage circuit coupled to a gate of said first current source load transistor and a gate of said second current source load transistor, said high-gain stage circuit providing said bias signal to bias said one bitline voltage output to a value of about the mid-point of a supply rail voltage where the Vt shift in the cell is best detected;

a signal damping network at the output of said high-gain stage circuit to dampen any oscillations triggered by a output voltage change or a change in said supply rail voltage; and a filter network to introduces a delay in the negative feedback circuit loop so as to prevent phase reversal at any node in the loop with a gain greater than unity.

25. The sense circuit of claim 20, wherein said sense amplifier circuit comprises a cross-coupled sense amplifier for receiving amplified voltage differential signal outputs for providing rail-to-rail outputs.

* * * * *